United States Patent [19]

Miyata

[11] Patent Number: 5,659,276
[45] Date of Patent: Aug. 19, 1997

[54] MAGNETIC FIELD GENERATOR FOR MAGNETRON PLASMA

[75] Inventor: Koji Miyata, Fukui-ken, Japan

[73] Assignee: Shin-Etsu Chemical Co., Ltd., Tokyo, Japan

[21] Appl. No.: 670,096

[22] Filed: Jun. 25, 1996

[30] Foreign Application Priority Data

Jul. 12, 1995 [JP] Japan ................................. 7-175889
Jul. 12, 1995 [JP] Japan ................................. 7-175898

[51] Int. Cl.$^6$ ................................................. C23C 14/00
[52] U.S. Cl. ................................................. 335/209
[58] Field of Search .......................... 336/98, 160, 165,
336/192, 198, 170, 178, 208; 335/210–212,
336–337, 285–288, 295–298, 302–306,
209

[56] References Cited

U.S. PATENT DOCUMENTS

| | | | |
|---|---|---|---|
| 4,746,417 | 5/1988 | Ferenbach et al. | 204/298.2 |
| 5,248,402 | 9/1993 | Ballentine et al. | 204/298.2 |
| 5,284,564 | 2/1994 | Maass | 204/298.2 |
| 5,345,207 | 9/1994 | GeBele | 335/298 |

FOREIGN PATENT DOCUMENTS

| | | |
|---|---|---|
| 0 606 097 | 7/1994 | European Pat. Off. . |
| 0 661 728 | 7/1995 | European Pat. Off. . |
| 7-169591 | 7/1995 | Japan . |

Primary Examiner—Aditya Krishnan
Attorney, Agent, or Firm—Wenderoth, Lind & Ponack

[57] ABSTRACT

The improvement proposed relates to the dipole ring magnet in a magnetic field generator for magnetron plasma in an apparatus for plasma sputtering or plasma etching. Different from the conventional dipole ring magnet, which is an assembly of anisotropic columnar segment magnets in a circular arrangement each in an integral columnar form, each of the segment magnets according to the first aspect of the invention is divided into upper and lower halves and the gap space held between the upper and lower halves is varied from position to position so that the uniformity of the magnetic field formed inside of the dipole ring magnet is increased in the horizontal direction with consequently increased uniformity of the plasma density generated thereby. Instead of dividing each of the segment magnets into the upper and lower halves, according to the second aspect of the invention, the circular arrangement of the segment magnets is not regular and symmetrical but assymmetrical relative to the direction of the magnetic field so that similar improvements to those in the first aspect of the invention can be accomplished in the uniformity of the magnetic field and in the density of the plasma.

2 Claims, 7 Drawing Sheets

MAGNETIC FIELD GENERATOR FOR MAGNETRON PLASMA

BACKGROUND OF THE INVENTION

The present invention relates to a magnetic field generator for magnetron plasma or, more particularly, relates to a magnetic field generator for magnetron plasma capable of generating a magnetic field having excellent uniformity so that a magnetron constructed therewith is very satisfactory for use in the processes of so-called magnetron sputtering and magnetron etching widely undertaken in the fields of electric and electronic technologies.

It is now conventional that the treatments of sputtering and etching in the above mentioned technological fields are conducted by utilizing the so-called magnetron plasma which is a plasma generated by utilizing a magnetron. Namely, a magnetron plasma is generated by utilizing a magnetron in the following manner. Thus, electrodes are inserted into the atmosphere of a gas such as argon filling a plasma chamber and electric discharge is caused thereby so that the gas filling the chamber is ionized to produce secondary electrons which in turn impinge on the gaseous molecules resulting in further ionization of the gaseous molecules. The primary and secondary electrons generated by the electric discharge enter a drift movement by virtue of the magnetic field generated by the magnetron and the electric field influencing the movement thereof. The electrons under the drift movement can impinge successively on gaseous molecules to cause ionization. thereof along with generation of further electrons which again act to ionize the gaseous molecules by impinging thereon. The very high efficiency of ionization obtained with a magnetron can be explained by the repetition of the above described process.

As is described above, a gas filling a plasma chamber can be ionized with a very high efficiency by utilizing a magnetron consequently increasing the density of plasma generated in the plasma chamber. Accordingly, the efficiency of the magnetron sputtering or magnetron etching can be higher by two to three times than the efficiency obtained in a conventional plasma chamber utilizing high-voltage electric discharge.

Figure 1A:
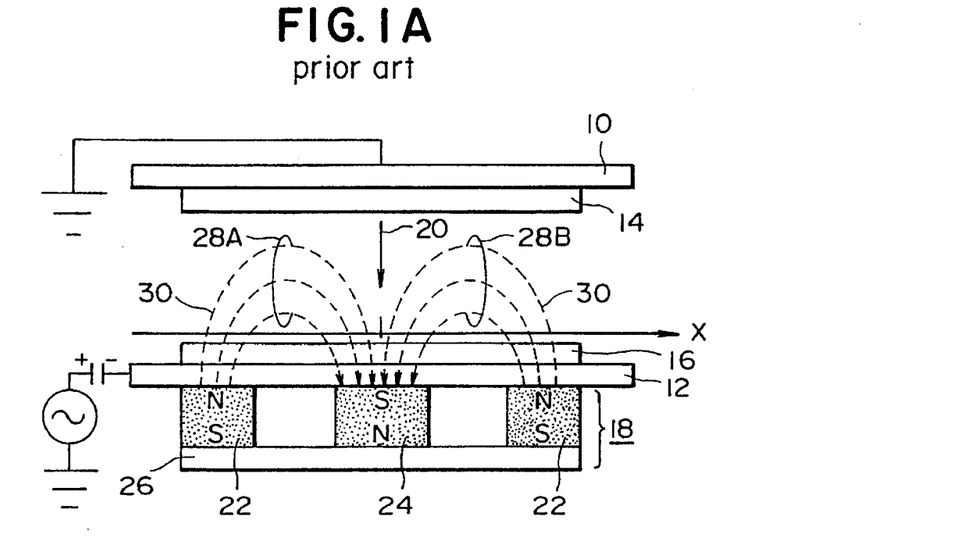
FIGS. 1A and 1B are a vertical cross sectional view and a perspective view, respectively, of a magnetron plasma-generating apparatus with a conventional magnetic field generator having an annular magnet.
Figure 1B:
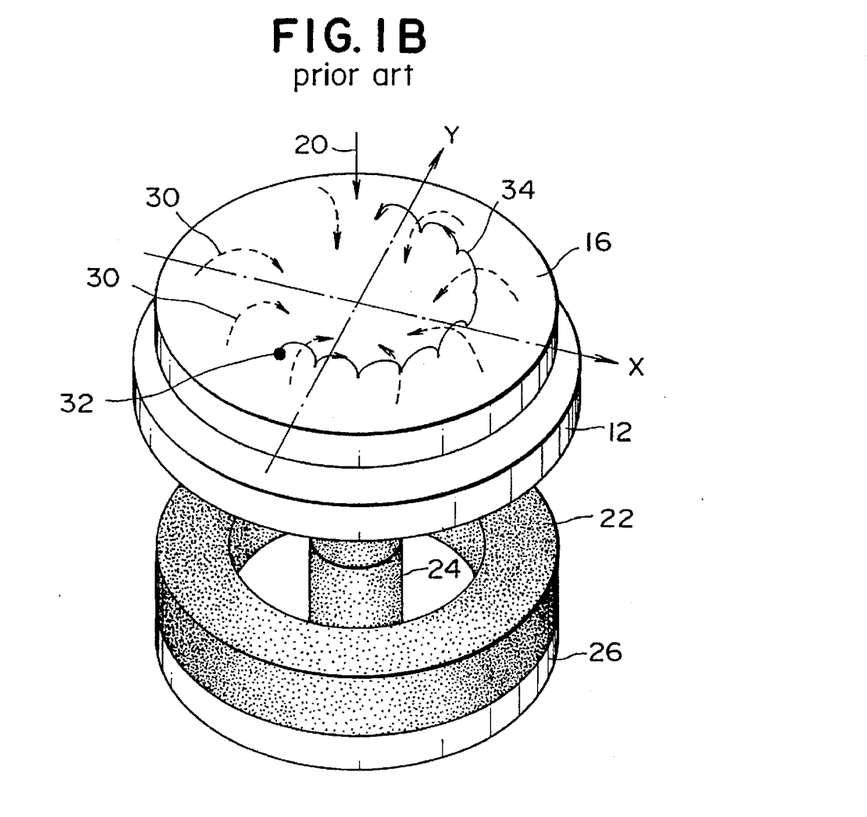

FIGS. 1A and 1B schematically illustrate a sputtering apparatus utilizing a conventional magnetron discharge unit by a vertical axial cross sectional view showing the magnetic field and by a perspective view showing movements of the electrons, respectively. Two electrode plates 10, 12 are provided in parallel with each other and a substrate 14, on which sputtering is performed, and a target 16 for sputtering are placed in the space between the electrodes 10, 12, respectively, each in contact with one of the electrodes 10, 12, which are connected to a high frequency power supply. The arrow 20 in FIG. 1A shows the direction of the electric field at a moment when the upper electrode 10 is the anode and the lower electrode 12 is the cathode. A magnetic field generator 18 for magnetron plasma is installed on the lower surface of the electrode 12. The magnetic field generator 18 consists of a yoke 26 and a set of permanent magnets 22 and 24 concentrically arranged and connected together at the lower surfaces by the yoke 26, the outer magnet 22 being annular and the center magnet 24 being cylindrical with the magnetic polarity reversed to that of the outer magnet 22 as is shown in FIG. 1A.

The lines of magnetic force 30 of the fluxes 28A and 28B come out of the N-pole of the outer magnet 22 and enter the S-pole of the center magnet 24 forming a leakage magnetic field above the target 16. Assuming that the direction of the electric field between the electrodes 10, 12 is from the top to the bottom as is shown by the arrow 20, the electron 32 on the surface of the target 16, which should be accelerated straightly upwardly in the absence of a magnetic field, now enters a drift movement by deflection in the direction of the outer product of the electric and magnetic fields along the infinite orbit 34. As a consequence, the electron 32 is under constraint in the vicinity of the surface of the target 16 with promotion of ionization of gaseous molecules. The above is the mechanism which explains the high density of the plasma generated in a magnetron plasma apparatus.

It should be noted here that contribution to the drift movement of electrons can be effected only by the component of the magnetic field in the direction perpendicular to the direction of the electric field. In FIGS. 1A and 1B, namely, only the component of the magnetic field in parallel to the surface of the target 16, referred to as the horizontal magnetic field hereinafter, can contribute to the ionization of the gaseous molecules by bringing the electrons into a drift movement.

Figure 2A:
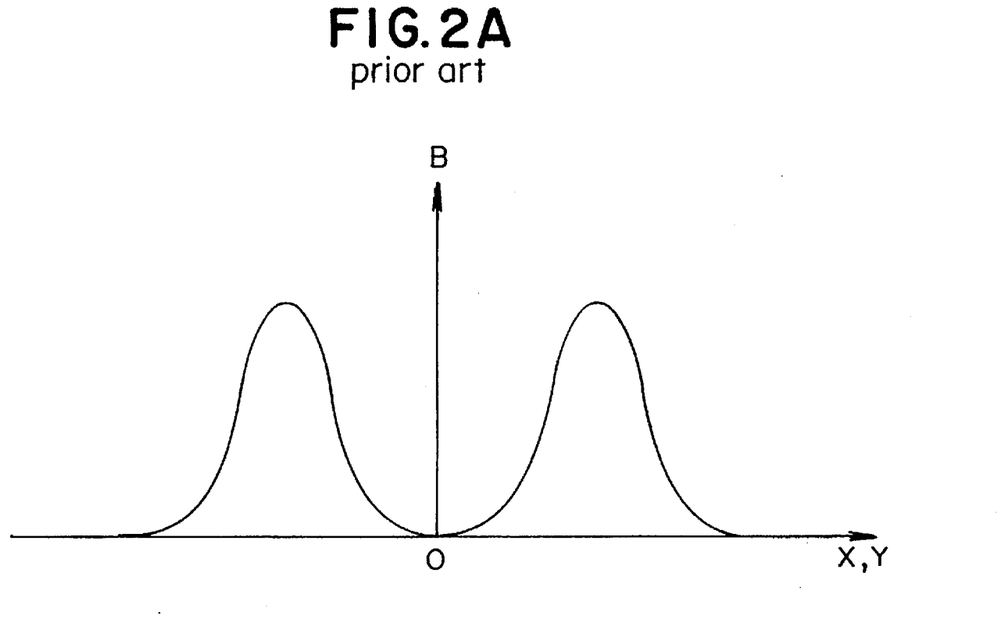
FIG. 2A is a graph showing the distribution of the magnetic field in the horizontal direction in the magnetic field generator illustrated in FIGS. 1A and 1B.
Figure 2B:
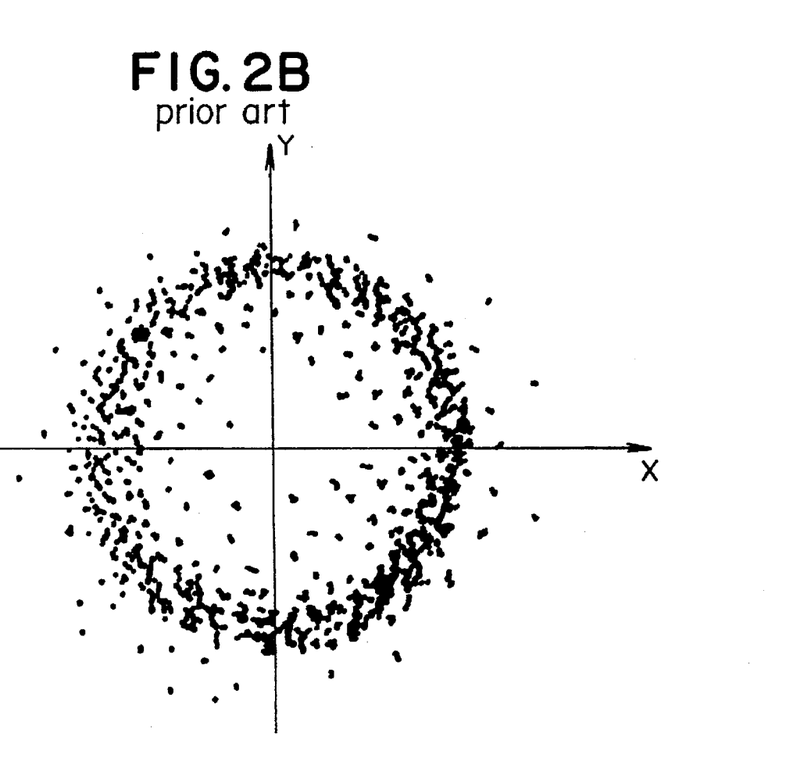
FIG. 2B is a diagram showing the distribution of the density of plasma corresponding to the magnetic field distribution shown in FIG. 2A.

FIG. 2A is a graph showing fie distribution of the component of the magnetic field in parallel to the surface of the target, i.e. the horizontal magnetic field, taken in the direction of the arrow X or Y in the magnetic field generator illustrated in FIGS. 1A and 1B. As is understood from the above given explanation for the drift movement of electrons, the magnetic field has an annular distribution so that the distribution curve of the magnetic field in the radial direction has two peaks as is shown in FIG. 2A. Needless to say, the density of plasma generated in the magnetic field depends on the component of, the magnetic field in parallel to the surface of the target, by which the electrons are brought into the drift movement, so that the density of the plasma has a distribution as shown in FIG. 2B by the spot-wise diagram. As a consequence, sputtering with the target proceeds intensely on the areas where the magnetic field has a large component in the direction parallel to the surface of the target to cause localized wearing of the target decreasing the utilization efficiency of the target material which is sometimes very expensive with an economical disadvantage.

The situation is also similar in the apparatus of plasma etching by using a magnetic field generator for magnetron plasma. Namely, the effect of etching proceeds on the surface of a substrate such as a semiconductor silicon single crystal wafer not uniformly but with a localized intensity resulting in a degradation of the quality of the products obtained by the etching treatment. Moreover, it is sometimes the case with such a non-uniform distribution of the plasma density that a phenomenon of so-called charge-up is caused, in which a substantial gradient is produced in the electric potential over the substrate surface, leading to eventual destruction of the semiconductor device under the treatment due to electric discharge.

In view of the above described problems, it is eagerly desired to develop a magnetic field generator for magnetron plasma capable of generating a magnetic field of which the uniformity in the distribution of the component in parallel to the target surface can be increased as high as possible. For example, a magnetic field generator with a dipole ring magnet is known, which, as is illustrated by a plan view and an axial cross sectional view in FIGS. 3A and 3B; respectively, is an assembly of a plurality of anisotropic columnar segment magnets 40, 40 supported within a non-magnetic frame 42 in a circular arrangement.

Figure 3A:
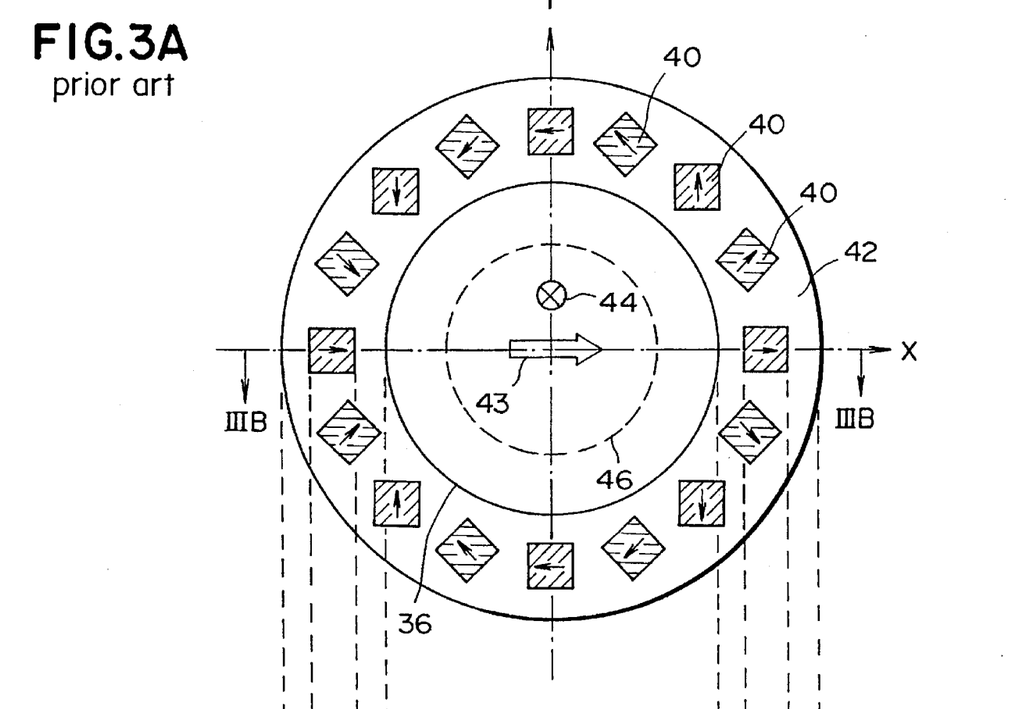
FIGS. 3A and 3B are a plan view and a vertical cross sectional view, respectively, of a magnetic field generator with a conventional dipole ring magnet.
Figure 3B:
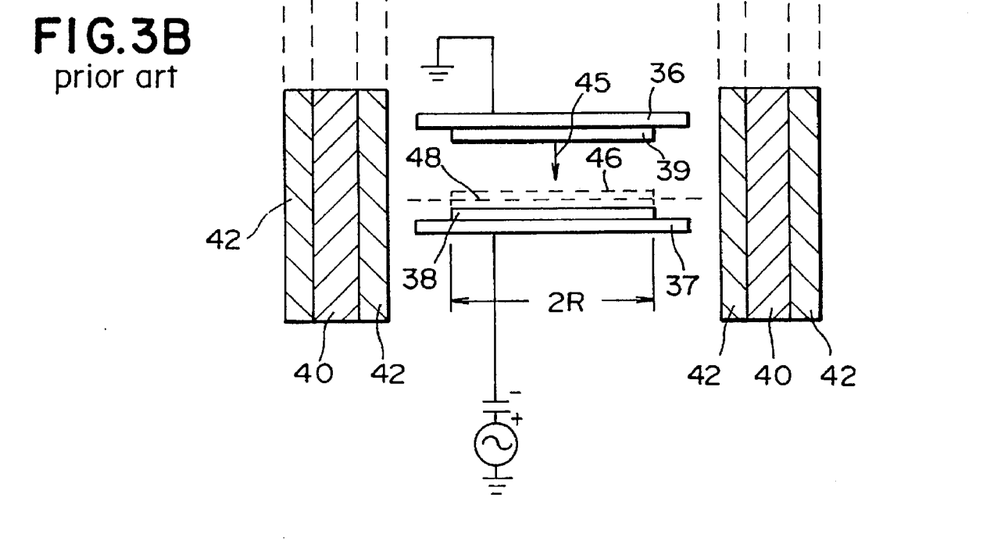

Different from the magnetic field having an annular distribution of the component in parallel to the target generated in the magnetic field generator illustrated in FIGS. 1A and 1B, the dipole ring magnet of FIG. 3A and FIG. 3B, which shows the cross section as cut and viewed along the direction shown by the arrows IIIB—IIIB in FIG. 3A, generates a magnetic field directed only in one and the same direction in parallel to the surface of the target mounted on the magnet so that the drift movement of electrons proceeds only in one direction not to solve the problem due to the non-uniformity in the distribution of the plasma density. This deficiency of the insufficient uniformity of the magnetic field can be solved partly by rotating the respective columnar segment magnets along the peripheral direction of the circular arrangement thereof although this means alone cannot be effective enough to accomplish full uniformity in the plasma density over a wide range.

The number of the anisotropic columnar segment magnets 40 supported by the non-magnetic frame 42 is at least 8 or, usually, in the range from 8 to 64 although FIG. 3A illustrates the case where the number is 16. The cross sectional profile of the columnar segment magnet 40 is not particularly limitative and can be circular, square, as is shown in FIG. 3A, rectangular or trapezoidal. The arrow mark given in the cross section of each columnar segment magnet indicates the direction of magnetization of the magnet. When the respective columnar segment magnets have the respective directions of magnetization as is indicated in FIG. 3A, a magnetic field in the direction indicated by the broad open arrow mark 43 is generated in the zone surrounded by the set of the columnar segment magnets 40.

When the above described dipole ring magnet is used in a magnetic field generator for magnetron plasma, the upper and lower parallel-plate electrodes 36, 37 are installed in the space surrounded by the columnar segment magnets 40 as is shown in FIG. 3B. The substrate 38 to be subjected to the sputtering treatment and the target 39 are mounted on the lower electrode 37 and upper electrode 36, respectively. The electrodes 36, 37 are connected to a high-frequency power supply so as to generate a high frequency electric field within the space between the electrodes 36, 37. The direction of the thus generated electric field is indicated by the arrow mark 44 or 45 in FIGS. 3A and 3B, respectively, assuming that the upper electrode 36 is the anode and the lower electrode 37 is the cathode at the moment.

It is preferable that the imaginary plane shown by the horizontal broken line 48 in FIG. 3B made by connecting the longitudinal center positions of the columnar segment magnets 40 coincides with the center plane of the effective plasma-working zone 46 having a diameter of 2R and indicated by the broken lines formed on the surface of the target 39 or silicon wafer 38 mounted on the lower electrode 37 by adequately adjusting the height of the target 39, when the treatment is for sputtering, or the wafer 38, when the treatment is for etching: This is because the uniformity of the magnetic field is higher in the longitudinal center height of the columnar segment magnets 40 than in the end portions and the magnetic field in the longitudinal center height of the magnets has in principle no component in the direction perpendicular to the electrode plates so as to accomplish an improved uniformity of the magnetic field and enhanced plasma density.

Figure 4A:
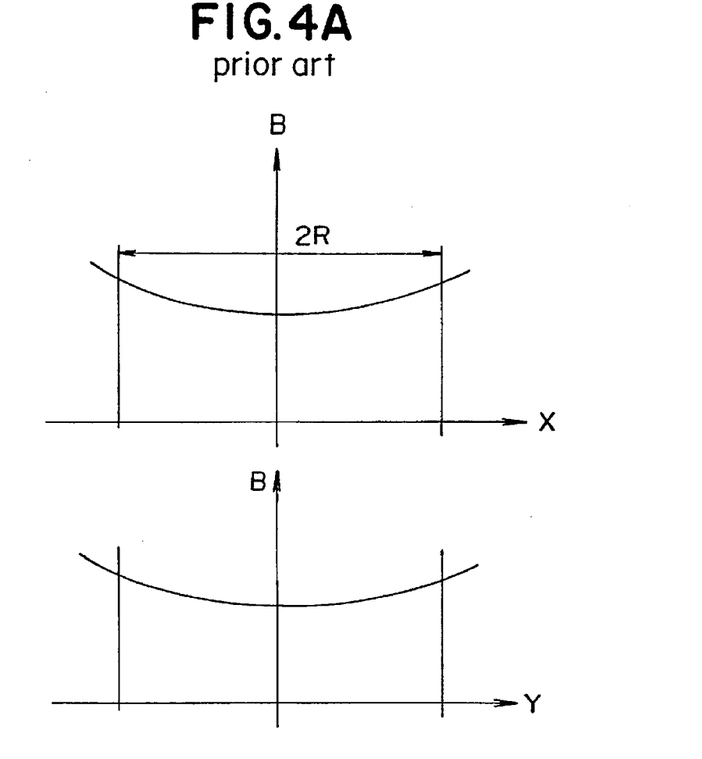
FIG. 4A is a graph showing the distribution of the magnetic field in the horizontal direction in the magnetic field generator illustrated in FIGS. 3A and 3B.
Figure 4B:
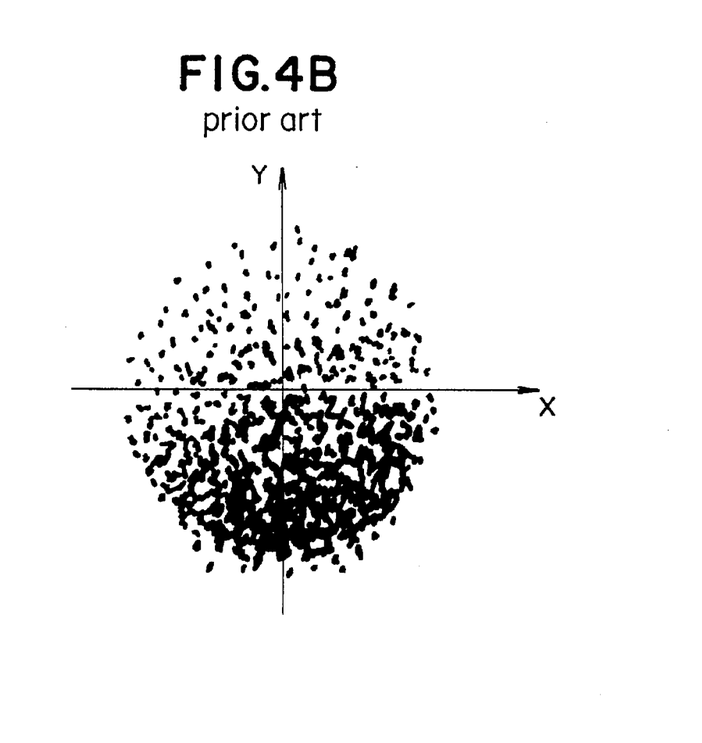
FIG. 4B is a diagram showing the distribution of the density of plasma corresponding to the magnetic field distribution shown in FIG. 4A.

FIG. 4A includes graphs showing the distribution of the magnetic field generated in the effective plasma-working zone 46 by the magnetic field generator using the above described dipole ring magnet along the lines indicated by the arrows X and Y, respectively, in FIG. 3A, from which it is understood that a substantial improvement can be obtained in the uniformity of the magnetic field in the horizontal direction as compared with the distribution shown in FIG. 2A. On the other hand, FIG. 4B shows a distribution diagram of the density of plasma generated in the magnetic field, which indicates non-uniformity of the plasma density being higher in the negative side of the arrow Y and lower in the positive side of the arrow Y. This phenomenon can be explained by the fact that the drift movement of electrons takes place in the direction of the outer product of the electric and magnetic fields so that the electrons proceeds towards the negative side of the arrow Y in FIG. 4B. This is the reason for the problem that, although the direction of the drift movement of electrons can be changed by the rotation of the dipole ring magnet along the peripheral direction of the circular arrangement of the magnets, full uniformity of the plasma density cannot be accomplished in a wide range by merely rotating the dipole ring magnet.

SUMMARY OF THE INVENTION

The present invention accordingly has an object to provide an improvement in the magnetic field generator using a dipole ring magnet in an instrument for magnetron plasma sputtering or magnetron plasma etching, by which high uniformity of the plasma density can be ensured over a wide range without the problems and disadvantages in the prior art magnetic field generators described above.

Thus, the present invention provides, in a first aspect of the invention, an improvement, in a magnetic field generator for magnetron plasma, which is installed in a magnetron apparatus for generation of high-density plasma, comprising a dipole ring magnet consisting of a plural number of anisotropic columnar segment magnets each extending in the vertical direction and arranged in a circular arrangement at approximately uniform distances each from the adjacent ones, which improvement comprises dividing each of the anisotropic columnar segment magnets into upper and lower halves and keeping a gap space between the upper half and the lower half of the anisotropic columnar segment magnet, the gap spaces having a dimension to correspond to the position at which the anisotropic columnar segment magnet is arranged in the circular arrangement or the dimensions of the gap spaces being not uniform.

The present invention provides, in a second aspect of the invention, an improvement, in a magnetic field generator for magnetron plasma, which is installed in a magnetron apparatus for generation of high-density plasma, comprising a dipole ring magnet consisting of a plural number of anisotropic columnar segment magnets each extending in the vertical direction and arranged in a circular arrangement, which improvement comprises arranging the anisotropic columnar segment magnets asymmetrically relative to the direction of the magnetic field formed inside of the dipole ring magnet.

DETAILED DESCRIPTION OF THE PEERED EMBODIMENTS

In the following, the improvement in a magnetic field generator with a dipole ring magnet according to the first and second aspects of the invention is described in detail by making reference to the accompanying drawing.

Figure 5A:
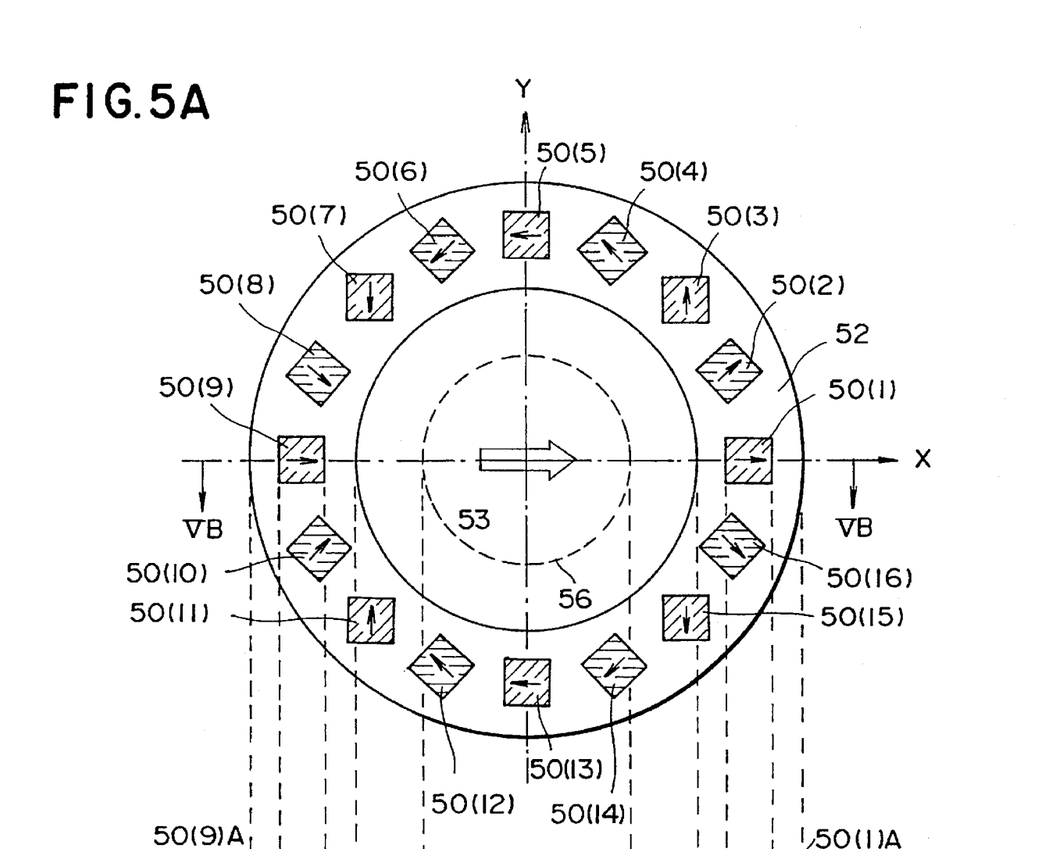
FIGS. 5A and 5B are a plan view and a vertical cross sectional view, respectively, of a magnetic field generator with a dipole ring magnet according to the first aspect of the invention.
Figure 5B:
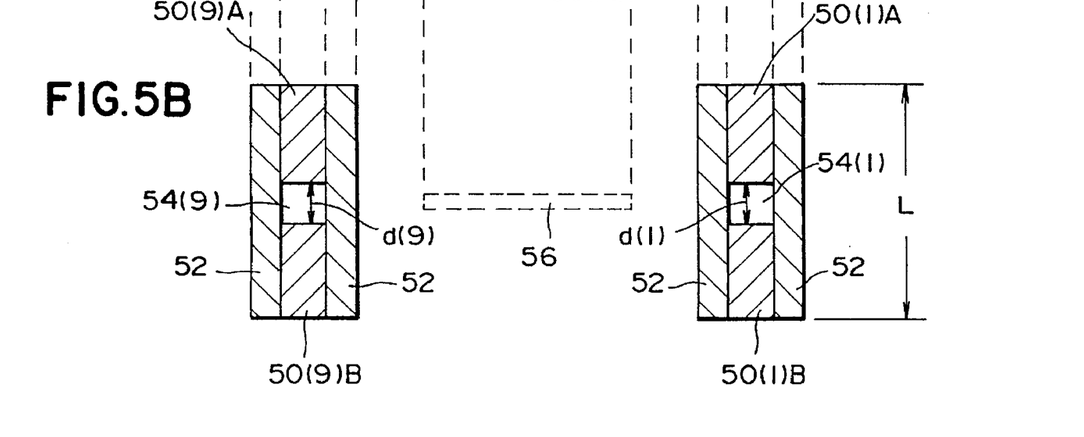

FIG. 5A schematically illustrates a plan view of the magnetic field generator improved according to the first aspect of the invention and FIG. 5B shows a vertical axial cross sectional view of the same as cut and viewed along the direction indicated by the arrows VB—VB in FIG. 5A. The dipole ring magnet shown in FIG. 5A is an assembly of 16 anisotropic columnar segment magnets 50(1) to 50(16), referred to as unit magnets hereinafter, each having a square cross section and embedded and supported in the non-magnetic frame 52. Needless to say, the number of such unit magnets is not limited to 16 but can be any number of at least 8, which number is preferably an even number. The direction of magnetization of the respective unit magnets 50(1) to 50(16) is indicated by the respective arrows. When the directions of magnetization of the respective unit magnets are as shown in FIG. 5A, the magnetic field inside of the dipole ring magnet as a whole has a direction indicated by the broad open arrow mark 53.

Different from the conventional dipole ring magnet illustrated in FIGS. 3A and 3B, in which each of the unit magnets 40 is in the form of a single integral rod, each of the unit magnets 50(1) to 50(16) illustrated in FIG. 5B is divided into upper and lower halves and held by keeping a gap space therebetween. For example, the unit magnet 50(1) is divided into an upper half 50(1)A and lower half 50(1)B and held with a gap space 54(1) therebetween, the dimension of the gap space 54(1) being d(1) as indicated by the double-sided arrow. Although all of the unit magnets are similarly divided into the upper and lower halves, the dimensions of the gap spaces 54(1) to 54(16) are not uniform but must be varied in such a fashion that the magnetic field along the direction of the Y-axis on FIG. 6A has such a distribution of monotonous increase from the negative side (lower end in FIG. 5A) to the positive side (upper end in FIG. 5A) of the Y-axis. It is necessary that the dimensions of the gap spaces in the two unit magnets positioned at symmetrical positions relative to the Y-axis be identical. In the arrangement of the 16 unit magnets illustrated in FIG. 5A, namely, following relationships are held: $d(1)=d(9)$; $d(2)=d(8)$; $d(3)=d(7)$; $d(4)=d(6)$; $d(10)=d(16)$; $d(11)=d(15)$; and $d(12)=d(14)$.

In an embodiment according to this first aspect of the invention, the actual values of the dimensions of the gap spaces 54(1) to 54(16) were set as follows: $d(1)=d(9)=0.81$ L mm; $d(2)=d(8)=0.72$ L mm; $d(3)=d(7)=0.61$ L mm; $d(4)=d(6)=0.55$ L mm; $d(5)=0.51$ L mm; $d(10)=d(16)=0.78$ L mm; $d(11)=d(15)=0.95$ L mm; $d(12)=d(14)=0.94$ L mm; and $d(13)=0.89$ L mm, in which L is the length of the respective unit magnets in mm before dividing into two portions.

Excepting the above described improvement, the dipole ring magnet according to the first aspect of the invention is not particularly limitative in respects of the types, number, arrangement and direction of magnetization of the unit magnets and can be about identical with conventional dipole ring magnets. Namely, the dipole ring magnet is an assembly of a plural number of unit magnets each held and supported in a non-magnetic frame 52 and the number of the unit magnets should be at least 8 or, usually, is selected in the range from 8 to 64 although the number of the unit magnets is 16 in the embodiment illustrated in FIGS. 5A and The cross section of each of the unit magnets can be circular, square, rectangular or trapezoidal.

Various kinds of known permanent magnets can be used for the unit magnets including rare earth-based permanent magnets, ferrite magnets, Alnico magnets and the like. Although FIGS. 5A and 5B illustrate the dipole ring magnet alone, the arrangement of the magnetic field generator for magnetron plasma can otherwise be the same as in the conventional apparatus illustrated in FIGS. 3A and 3B.

Figure 7A:
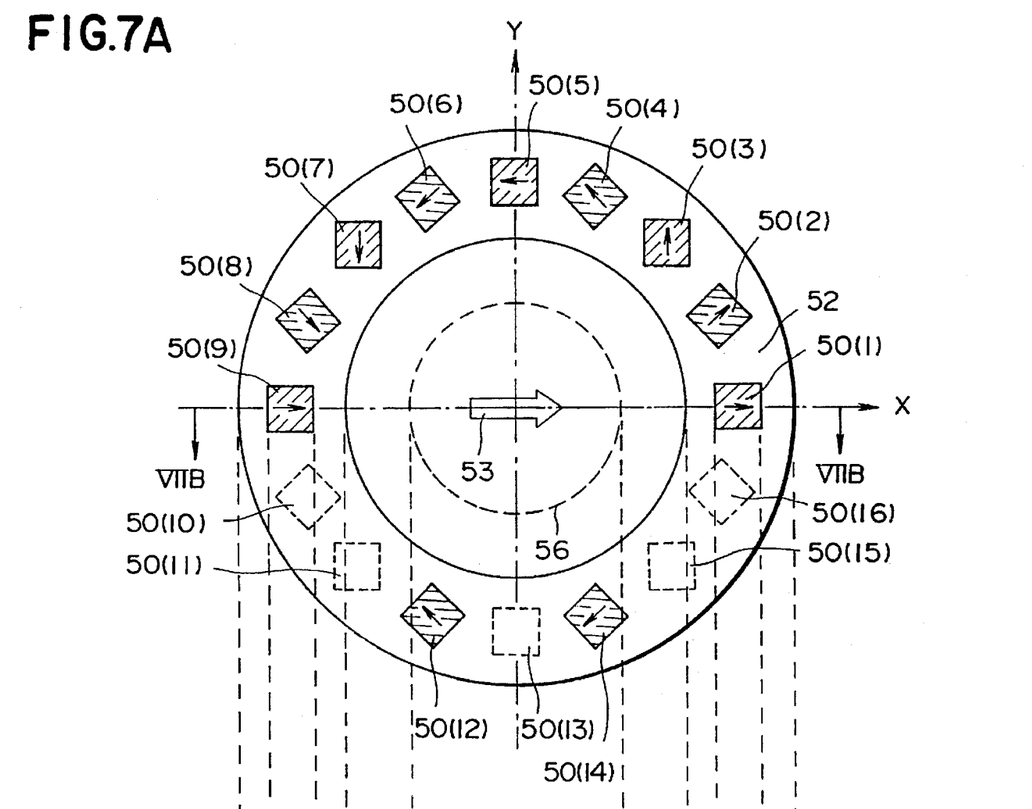
FIGS. 7A and 7B are a plan view and a vertical cross sectional view, respectively, of a magnetic field generator with a dipole ring magnet according to the second aspect of the invention.
Figure 7B:
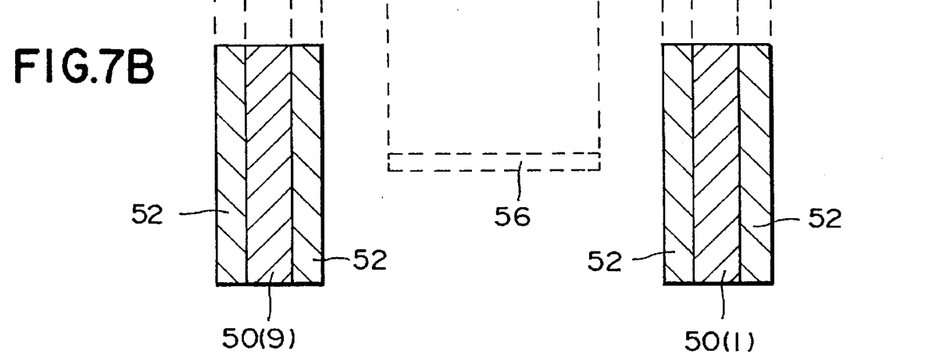

FIG. 7A illustrates a dipole ring magnet as improved according to the second aspect of the invention by a plan view and FIG. 7B illustrates a vertical axial cross section of the same as cut and viewed along the direction indicated by the arrows VIIB—VIIB in FIG. 7A.

Similarly to the conventional dipole ring magnet illustrated in FIGS. 3A and 3B, a plural number of anisotropic columnar segment magnets, i.e. unit magnets, 50(1) to 50(16) are to be held and supported in a non-magnetic frame 52 symmetrically to the Y-axis in FIG. 7A. Different from the conventional embodiment illustrated in FIG. 3A, in which 16 unit magnets 40 are in a circular arrangement keeping a uniform distance from the adjacent ones with symmetry relative to the X-axis and Y-axis, the arrangement of the unit magnets 50(1) to 50(16) in FIG. 7A is not symmetrical relative to the X-axis with omission of the unit magnets 50(10), 50(11), 50(13), 50(15) and 50(16) as is shown by the broken line squares indicating the respective imaginary positions of the omitted unit magnets. It should be noted that the positions including those of the actual unit magnets and those of the omitted or imaginary unit magnets are arranged each keeping the identical distance from the adjacent ones.

Figure 6A:
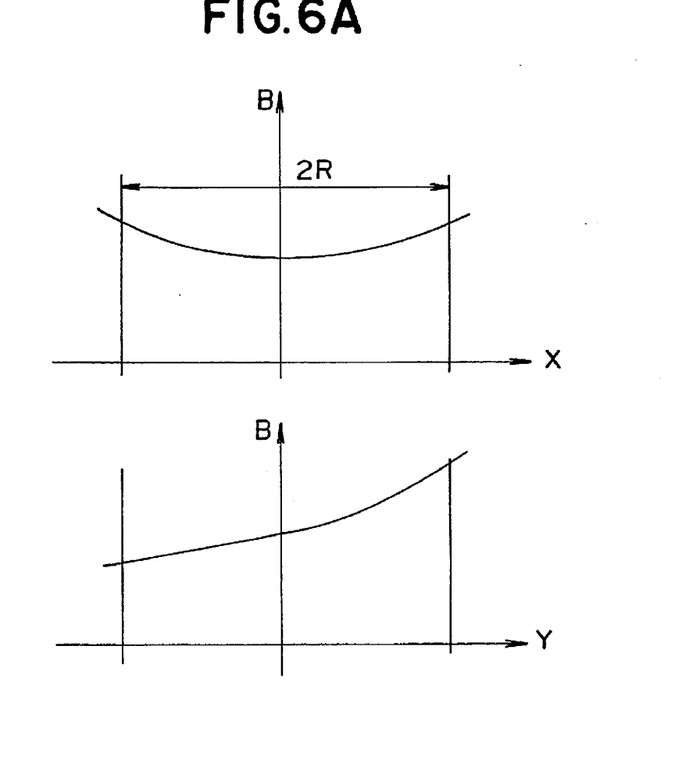
FIG. 6A is a graph showing the distribution of the magnetic field in the horizontal direction in the magnetic field generator illustrated in FIGS. 5A and 5B. Fibre 6B is a diagram showing the distribution of the density of plasma corresponding to the magnetic field distribution shown in FIG. 6A.
Figure 6B:
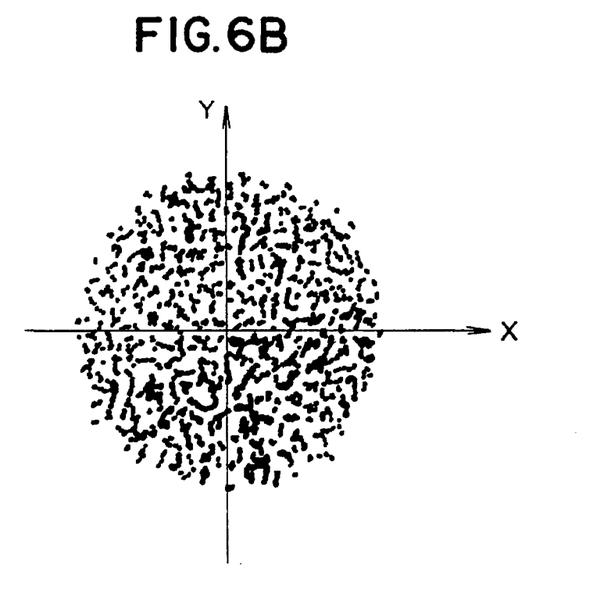

As a consequence of the above described asymmetrical arrangement of the unit magnets or omission of some of the unit magnets in the region where the magnetic field in the horizontal direction is low, the magnetic field thus formed inside of the dipole ring magnet has such a gradient as shown in FIG. 6A that the magnetic field is low in the negative side of the Y-axis and monotonously increases toward the positive side of the Y-axis. Although FIGS. 7A and 7B are given for the asymmetric arrangement of 11 unit magnets by omitting five unit magnets from the 16 unit magnets to be uniformly arranged in a circular fashion, the way to have an assymmetric arrangement of the unit magnets is not limited to this embodiment with a possibility of various modifications. It is of course optional that each of the actual unit magnets 50(1) to 50(16), from which some are omitted, is divided, according to the first aspect of the invention, into upper and lower halves keeping a varied gap space therebetween as is illustrated in FIG. 5B.

In the following, the two embodiments of the present invention described above are illustrated in more detail By way of examples and comparative examples.

EXAMPLE 1.

The general arrangement of the unit magnets was as shown in FIGS. 5A and 5B, in which 16 unit magnets 50(1) to 50(16), each being a neodymium-iron-boron magnet and having a length L of 150 mm and a 30 mm by 30 mm square cross section, were symmetrically arranged as shown in FIG. 5A. Each of these unit magnets was divided into upper and lower halves and held by keeping a gap space therebetween of a dimension specified before, i.e. $d(1)=d(9)=0.81$ L mm; $d(2)=d(8)=0.72$ L mm; $d(3)=d(7)=0.61$ L mm; $d(4)=d(6)=0.55$ L mm; $d(5)=0.51$ L mm; $d(10)=d(16)=0.78$ L mm; $d(11)=d(15)=0.95$ L mm; $d(12)=d(14)=0.94$ L mm; and $d(13)=0.89$ L mm. The distribution of the magnetic field inside of the dipole ring magnet within the plasma space 56 in the horizontal direction is measured at the height corresponding to the gap spaces in the respective unit magnets to give the results shown in FIG. 6A in the directions of the X-axis and Y-axis. The distribution of the plasma density generated in the plasma-working zone 56 under the magnetic field having such a distribution is shown in FIG. 5B.

In the above mentioned evaluation tests of the dipole ring magnet, measurements were conducted in the following manner. Thus, the distribution of the horizontal magnetic field was determined by moving a Hall element within the space and the outputs of the Hall element at the respective points were read on a gauss meter. The distribution of the plasma density was measured according to the electrostatic probe method by moving a probe within the space and the current-voltage characteristic when a voltage was applied to the probe was measured, from which the density of plasma was calculated with the thus obtained values of the electron temperature and electron density.

Comparative Example 1.

The experimental procedure was substantially the same as in Example 1 described above except that each of the unit magnets was not divided into the upper and lower halves but was an integral single magnet. The distribution of the horizontal magnetic field was considerably uniform in the directions of the X-axis and Y-axis as is shown in FIG. 4A but the distribution of the plasma density was far from uniformity as is shown in FIG. 4B.

Comparative Example 2.

Measurements were performed for the distribution of the horizontal magnetic field and the distribution of the plasma density with the conventional magnetic field generator having an annular magnet as illustrated in FIGS. 1A and 1B. The distribution curve of the horizontal magnetic field had a profile with two peaks as is shown in FIG. 2A in the directions of both of the X-axis and Y-axis and the plasma density had an annular distribution as shown in FIG. 2B.

EXAMPLE 2.

The experimental arrangement was substantially the same as in Comparative Example 1 described above except that five unit magnets among the 16 unit magnets in Comparative Example 1 were omitted as is illustrated in FIGS. 7A and 7B. The results were as satisfactory as in Example 1.

What is claimed is:

1. In a magnetic field generator for magnetron plasma, which is installed in a magnetron apparatus for generation of high-density plasma, comprising a dipole ring magnet consisting of a plural number of anisotropic columnar segment magnets each extending in the vertical direction and arranged in a circular arrangement at approximately uniform distances each from the adjacent ones, the improvement which comprises dividing each of the anisotropic columnar segment magnets into upper and lower halves and keeping a gap space between the upper half and the lower half of the anisotropic columnar segment magnet, the gap space having a varied dimension to correspond to the position thereof at which the anisotropic columnar segment magnet is arranged in the circular arrangement.

2. In a magnetic field generator for magnetron plasma, which is installed in a magnetron apparatus for generation of high-density plasma, comprising a dipole ring magnet consisting of a plural number of anisotropic columnar segment magnets each extending in the vertical direction and arranged in a circular arrangement, the improvement which comprises arranging the anisotropic columnar segment magnets asymmetrically relative to the direction of the magnetic field formed inside of the dipole ring magnet.

* * * * *